(12) United States Patent
Bright et al.

(10) Patent No.: US 7,967,978 B2
(45) Date of Patent: Jun. 28, 2011

(54) METHOD AND APPARATUS FOR FILTER CONDITIONING

(75) Inventors: Jeffrey J. Bright, New Paltz, NY (US); George L. Mack, Pleasant Valley, NY (US); Michael J. Schade, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1233 days.

(21) Appl. No.: 11/608,863

(22) Filed: Dec. 11, 2006

(65) Prior Publication Data

US 2008/0135498 A1    Jun. 12, 2008

(51) Int. Cl.
*B01D 35/00*        (2006.01)
*B01D 29/00*        (2006.01)
(52) U.S. Cl. ......... 210/98; 210/90; 210/143; 210/195.1; 210/196; 210/416.1; 210/418
(58) Field of Classification Search ...................... 210/98
See application file for complete search history.

(56) References Cited

U.S. PATENT DOCUMENTS 6,425,497 B1    7/2002  Chu et al.

OTHER PUBLICATIONS

Entegris, Inc., Intelligen Mini Dispense System, Advanced two-stage technology delivers ultimate defect reduction in point-of-use photochemical dispense, Copyright Mar. 2006 Entegris, Inc., 5 pages.
Mutsuhiro Amari, et al., Effect of Filter Surface Chemistry and Morphology on 193 nm Lithography Applications, SEMICON Korea 2005 Mykrolis Corproation, 9 pages.
Phong Do, et al., Optimized filtration for reduced defectivity and improved dispense recipe in 193 nm BARC lithography, Copyright 2004 Society of Photo-Optical Instrumentation Engineers, 8 pages.

*Primary Examiner* — Duane Smith
*Assistant Examiner* — Paul J. Durand
(74) *Attorney, Agent, or Firm* — Cantor Colburn LLP; Ian MacKinnon

(57) ABSTRACT

An apparatus for preconditioning a filter media includes a reservoir containing a liquid; a pump operatively connected and in fluid communication with the reservoir; a filter housing operatively connected and in fluid communication with the reservoir and the pump, and having a filter media disposed therein; a control unit operatively connected to the pump; and wherein the pump is operable to circulate the liquid through the filter media to wet and remove air from the filter media prior to installation of the filter media in a processing application.

6 Claims, 3 Drawing Sheets

METHOD AND APPARATUS FOR FILTER CONDITIONING

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to a filter conditioning apparatus, and more particularly to providing a structure and method for enhanced pretreatment of a filter used with lithographic compositions prior to process application.

2. Description of the Background

The continued miniaturization of circuit features in semiconductor manufacturing has led to increased demand for finer and smaller lithographic features. Finer lithographic features require a well defined and defect free application of anti-reflective coating materials and compounds, such as photoresists. It has been determined that for acceptable semiconductor device yields employing finer lithographically produced circuit features, proper filter conditioning and filtration of photoresists combined with optimized application pumps are required. The continued evolution to finer pore sizes used in resist filters has led to difficulties in filter wetting, and the expulsion of air out of the filter media. If air has not been completely removed from the filter, the air will gradually be introduced into the compounds and photoresists that pass through the filter, thereby introducing air pockets or bubbles into the compounds. The bubbles result in defects in the applied compounds and resists that may have an adverse affect on semiconductor formation and performance. The potential resultant defects include image distortion at expose, breakthrough during reactive ion etching (RIE) processing, open line or trace defects. In addition, particle generation can occur if the bubbles burst during processing or use.

The present practice employed to precondition filters, employed in a lithographic process, is to continuously wet the filter until the expulsion of air out of the filter is complete. The photoresist solution used to precondition the filter is continuously dispensed to a drain or a waste receptacle. The venting and purging process to completely flush residual air from the filter can take from a couple of hours to a couple of days to complete. The present filter conditioning process is an expensive, waste generating, and time consuming process.

SUMMARY OF THE INVENTION

Embodiments of the present invention comprise an apparatus for preconditioning a filter media comprising: a reservoir containing a liquid; a pump operatively connected and in flow communication with the reservoir; a filter housing operatively connected and in flow communication with the reservoir and the pump, and having a filter media disposed therein; a control unit operatively connected to the pump; and wherein the pump is operable to circulate the liquid through the filter media to wet and remove air from the filter media prior to installation of the filter media in a processing application.

An additional embodiment of the present invention comprises an apparatus for preconditioning a filter media for filtering a photoresist solution for use in a photolithographic process that is employed in integrated circuit manufacturing comprising: a reservoir containing the photoresist solution; a pump operatively connected and in flow communication with the reservoir; a filter housing operatively connected and in flow communication with the reservoir and the pump, and having a filter media disposed therein; a control unit operatively connected to the pump; and wherein the pump is operable to circulate the photoresist solution through the filter media to wet and remove air from the filter media prior to installation of the filter media in a photolithographic process.

A method for preconditioning a filter is also provided. The method comprising: placing a fluid within a reservoir; placing the filter media in a filter housing; setting process parameters with a control unit; activating a pump to circulate the fluid from the reservoir through the filter disposed in the filter housing; determining when the filter media has finished being conditioned; closing the pump; removing the conditioned filter media from the filter housing; placing the conditioned filter media in a production process; wherein the preconditioning of the filter media facilitates the removal of air from the filter media.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved in which conditioning of filters employed in lithographic processes is provided in a self contained bench top unit comprising a resist supply, filter housing, pump, and controller, that can be used to precondition a filter without impacting a production tool, and with a minimum of waste generation.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF SPECIFIC EMBODIMENTS

Embodiments of the present invention provide an apparatus and method for conditioning of filters employed in lithographic processes. The apparatus of the present invention is a self contained bench top unit including a resist supply, filter housing, pump, and controller, that can be used to precondition a filter without impacting a production tool, and with a minimum of waste generation. The conditioning process involves continuously wetting the filter until the expulsion of air out of the filter is complete. Unlike the existing process, the liquid resist solution is continuously recirculated within a closed system and is not discarded. In addition, embodiments of the present invention can be used to condition filters used with other fluids and solutions, such as coatings, sealants, thin films, and thick films, etc.

Figure 1:
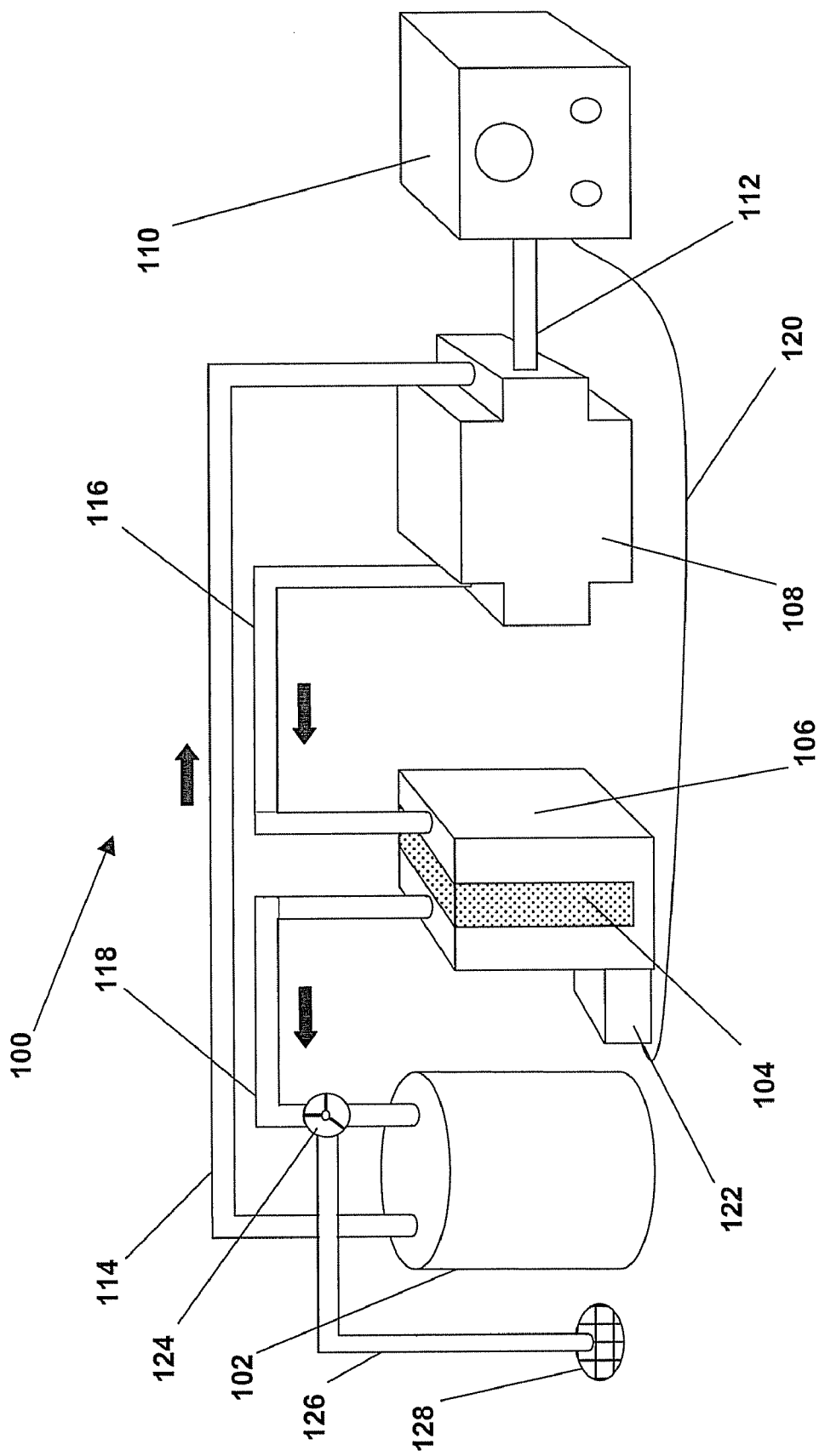
FIG. 1 is schematic view of an apparatus used in the filter conditioning process, according to an embodiment of the present invention.

FIG. 1 is a schematic representation of the major components that form the filter conditioning apparatus 100 of an embodiment of the present invention. A reservoir 102 contains the liquid that will be used to condition the filter 104 that is held in a filter conditioning housing 106. A pump 108 is electrically connected to a control unit 110 via electrical interconnect 112. The pump 108 may be self-priming, or may require manual priming. The control unit 110 can be used to set process parameters such as pressure, flow rate, and processing time. In addition the control unit 110 can be configure to selectively run the pump 108 on a continuous or intermittent cycle to purge the air from the filter 104. The pump 108 is supplied with fluid from the reservoir 102 via supply conduit 114, and outputs the fluid via pump conduit 116 to supply the filter conditioning housing 106 with fluid to condition the filter 104. The fluid passes through the filter 104, and exits the filter conditioning housing 106 via conditioning conduit 118 that discharges the fluid back into the reservoir 102, from which the fluid will be recirculated through the conditioning apparatus 100. The control unit 110 may be connected electrically via electrical interconnect 120 to sensors 122 attached to the filter conditioning housing 106. The sensors can provide real-time feedback on the condition of the filter 104, and provide a signal to the control unit 110 to automatically shut down the pump 108. Upon completion of the conditioning process, the filter 104 is removed from the filter conditioning housing 106, and placed into the production process (track system) for which it was intended. If there are no additional filters to condition with the fluid, the filter conditioning apparatus 100 is cleaned by flushing a solvent, which is placed in the reservoir 102, through the pump 108, and conduits 114, 116, and 118. A three-way valve 124, which diverts the flows in the filter conditioning apparatus 100, is connected to a drainpipe 126 that terminates in a drain 128 that is employed to dispose of the flushing solvent used in the cleanup process.

Figure 2:
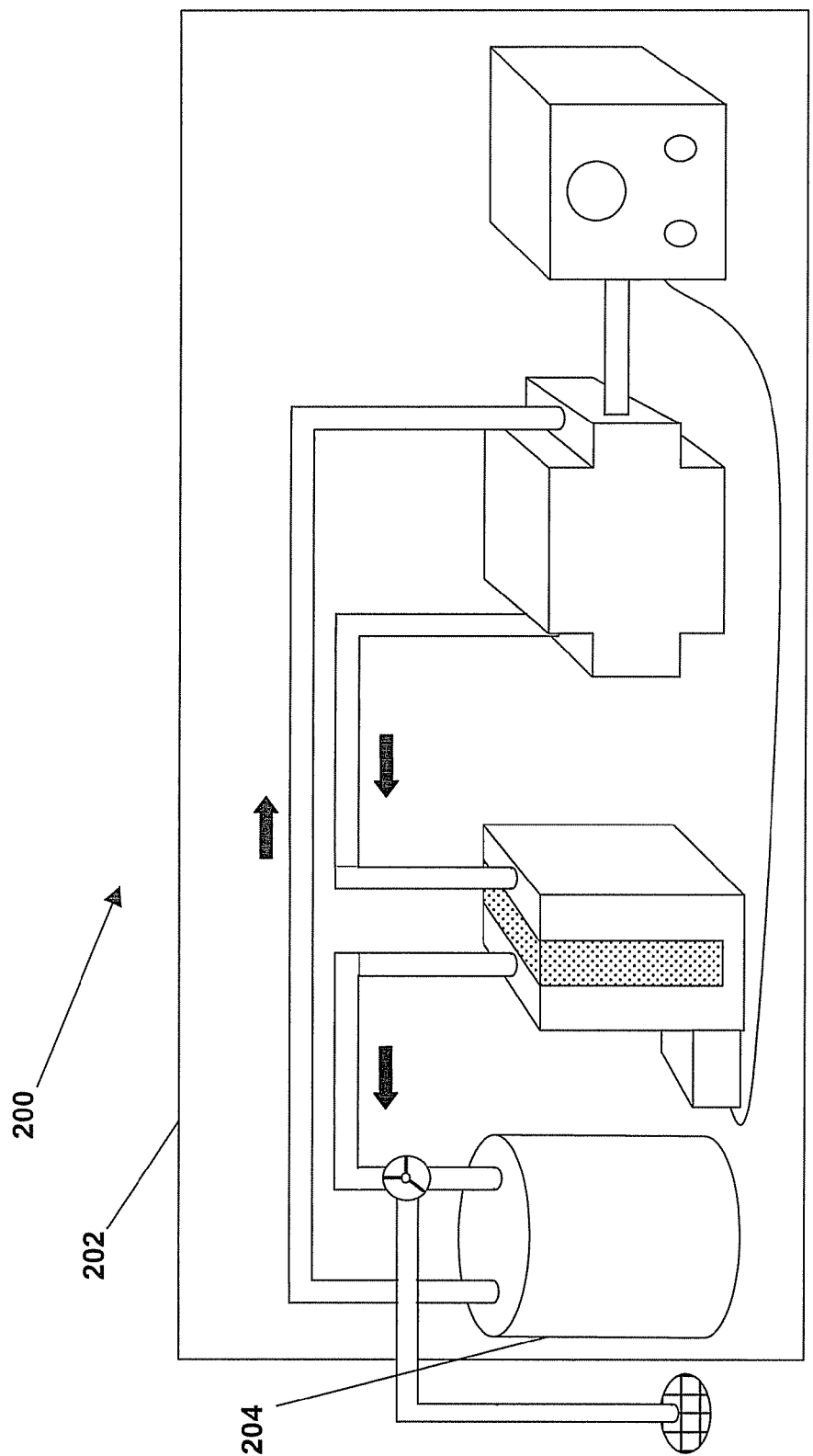
FIG. 2 is schematic view of an apparatus used in the filter conditioning process integrated in a single housing, according to an embodiment of the present invention.

FIG. 2 is an alternative embodiment of the present invention of a filter conditioning apparatus 200, where the reservoir, pump, filter housing, and controller can be consolidated into a single housing 202. The housing can be designed to accept pre-packaged liquid containers, such as NOWPak® photoresist to act as the reservoir 204.

Figure 3:
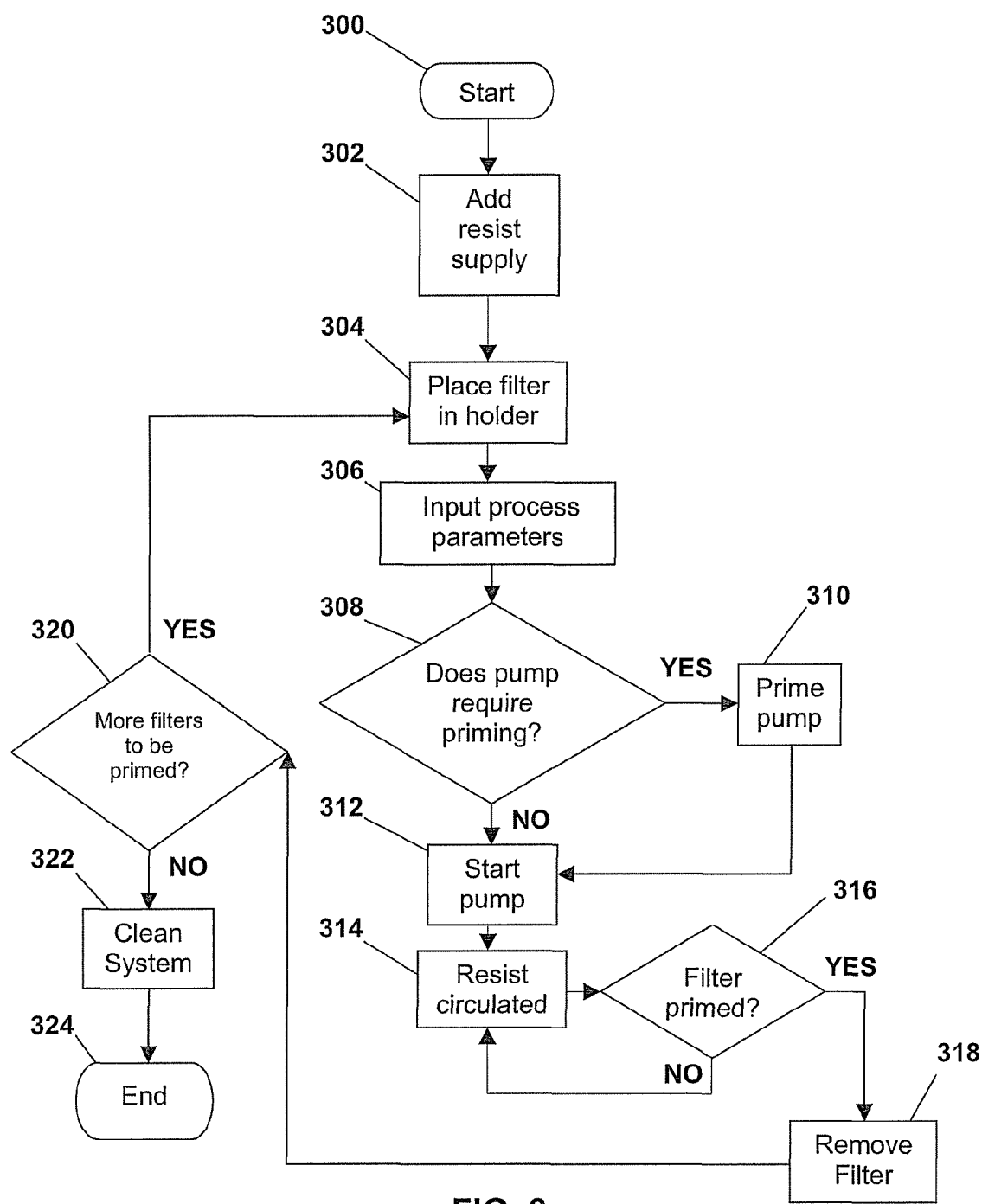
FIG. 3 is a flowchart of a filter conditioning process, according to an embodiment of the present invention.

FIG. 3 is a flow diagram that outlines the steps of conditioning a filter according to an embodiment of the present invention. The process starts (300) with the addition of a supply of resist (302) and the placement of a filter to be conditioned in the filter holder (304). Process parameters, such as, pressure, flow rate, and processing time are inputted into the controller (306). The pump is primed (if required-dependent on pump design) (308, 310) and the controller starts the pump (312). The resist fluid is circulated through the filter (314) until the process is completed (316, 318) and the filter is removed and placed into the production line process or the proper dispense line on the photo track. If additional filters require conditioning (320) with the same resist, the additional filters are loaded into the filter holder (304) and the conditioning process is repeated as required. If there are no more filters to condition (320), the system is cleaned (322) by flushing a solvent through the filter conditioning system and dispensing the solvent to the drain. The system is then shut down (324).

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for preconditioning a filter media, comprising:
 a reservoir containing a liquid;
 a pump operatively connected and in fluid communication with said reservoir;
 a filter housing operatively connected and in fluid communication with said reservoir and said pump, and having a filter media disposed therein;
 a control unit operatively connected to said pump; and
 wherein said pump is operable to draw the liquid from the reservoir and to circulate said liquid through the filter media to wet and remove air from the filter media prior to installation of the filter media in a processing application and to return the liquid back to the reservoir.

2. The apparatus of claim 1, wherein said reservoir, said pump, and said filter housing form a closed circulation system; and
 wherein said liquid is continuously recirculated within said closed circulation system.

3. The apparatus of claim 1, wherein said reservoir, said pump, said filter housing, and said control unit are integrated into a single enclosure.

4. The apparatus of claim 1, wherein said reservoir is configured to accept prepackaged liquid containers.

5. The apparatus of claim 1, wherein said liquid comprises a photoresist solution; and
 wherein said processing application is a photolithographic process.

6. The apparatus of claim 5, wherein said photolithographic process is employed in integrated circuit manufacturing.

* * * * *